United States Patent
Youngner

(10) Patent No.: US 6,714,007 B2
(45) Date of Patent: Mar. 30, 2004

(54) OPTICALLY POWERED RESONANT INTEGRATED MICROSTRUCTURE MAGNETIC FIELD GRADIENT SENSOR

(75) Inventor: Daniel W. Youngner, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/051,489

(22) Filed: Jan. 18, 2002

(65) Prior Publication Data

US 2003/0137296 A1 Jul. 24, 2003

(51) Int. Cl.[7] ............... G01R 33/032; G01R 33/022
(52) U.S. Cl. .................... 324/244.1; 385/12
(58) Field of Search ............... 324/244, 244.1, 324/259, 260; 73/862.59, 862.69; 385/12, 13; 438/18, 52, 65; 257/431; 359/197

(56) References Cited

U.S. PATENT DOCUMENTS

| | | | | |
|---|---|---|---|---|
| 4,433,291 A | * | 2/1984 | Yariv et al. ............... | 324/244.1 |
| 5,493,222 A | * | 2/1996 | Shirai et al. ............. | 324/244.1 |
| 5,559,358 A | * | 9/1996 | Burns et al. ............. | 257/431 |
| 5,747,705 A | | 5/1998 | Herb et al. ............. | 73/862.59 |
| 5,808,210 A | | 9/1998 | Herb et al. ............. | 73/862.59 |
| 6,031,944 A | | 2/2000 | Youngner ............. | 385/12 |
| 6,426,013 B1 | * | 7/2002 | Neukermans et al. ........ | 216/24 |
| 6,429,652 B1 | * | 8/2002 | Allen et al. ............. | 324/259 |
| 6,479,921 B2 | * | 11/2002 | Ma et al. ............. | 310/309 |
| 6,501,268 B1 | * | 12/2002 | Edelstein et al. ........ | 324/244 |
| 6,507,187 B1 | * | 1/2003 | Olivas et al. ......... | 324/207.21 |

FOREIGN PATENT DOCUMENTS

EP 0 451 992 A2 10/1991

OTHER PUBLICATIONS

Kang et al. "Amplitude Detecting Micromechanical Resonating Beam Magnetometer," Proceedings of the 11th Annual International Workshop on Micro Electro Mechanical Systems, Jan. 25–29, 1998, pp. 372–377.*
Liu, Chang, "Development of Surface Micromachined Magnetic Actuators Using Electroplated Permalloy," Journal of Mechatronics, 1998, pp. 613–633.*
David W. Burns, "Resonant Microbeam Sensors", Scientific Honeyweller 1996, pp. 6–108.

* cited by examiner

Primary Examiner—N. Le
Assistant Examiner—Darrell Kinder
(74) Attorney, Agent, or Firm—Kris T. Fredrick

(57) ABSTRACT

A device 10 for sensing a magnetic field gradient using an optically powered resonant integrated microstructure (O-RIMS). The O-RIMS comprises a microbeam 11 having a resonant frequency, a shell 16 supporting the microbeam 11, sensor electronics, a light transporter 36, such as an optical fiber or optical waveguide, in proximity to the shell 16, and a ferromagnetic or magnetically permeable element 26 attached to the shell 16. The ferromagnetic or magnetically permeable element 26 experiences a torque about the fulcrum 24 when a magnetic field gradient is present, and causes a strain on the shell 16. The strain is in turn transmitted to the microbeam 11, thereby affecting its resonant frequency. The change in resonant frequency of the microbeam 11 is conveyed to the sensor electronics via the light transporter 36.

7 Claims, 3 Drawing Sheets

OPTICALLY POWERED RESONANT INTEGRATED MICROSTRUCTURE MAGNETIC FIELD GRADIENT SENSOR

TECHNICAL FIELD OF THE INVENTION

The present invention relates to magnetic field gradient sensor devices, and more particularly, to a magnetic field gradient sensor device incorporating an optically powered resonant integrated microstructure (O-RIM).

BACKGROUND OF THE INVENTION

In a typical O-RIMS (optically powered-resonant integrated microstructure) device, a microbeam having a resonant frequency is held by supports and vacuum encapsulated by a polysilicon shell. The microbeam and the shell are supported by a silicon substrate, all of which together form a micromachined integrated silicon device. A typical O-RIMS device is further provided with an optical fiber which is positioned in proximity to the resonant microbeam.

Light generated by a light emitting diode (LED), laser or other light source, arrives at the O-RIMS device via the optical fiber, passes through the shell, partially through the microbeam, and on to a photodiode situated beneath the resonant microbeam. The shell is partially reflective and partially transparent to the light delivered by the optical fiber. The shell, the microbeam and the substrate create a Fabry-Perot cavity, such that light waves reflected from these surfaces constructively and destructively interfere with one another as they re-enter the optical fiber, creating an optical signal whose intensity changes as the microbeam moves up and down.

The microbeam is excited to resonance by the arrival of the light through the optical fiber striking the photodiode causing charge to build up there, creating an electrostatic attraction to the microbeam. The electrostatic attraction causes the microbeam to flex, and as the microbeam approaches its maximum flexure, its potential energy builds to a point where its restoring force overcomes the electrostatic attraction. The microbeam then springs toward a neutral or resting position, where the electrostatic attraction builds again, flexing the microbeam again, and exciting resonance in the microbeam.

The addition of a suitable ferromagnetic or magnetically permeable element and fulcrum to the typical O-RIMS structure, transforms the O-RIMS into a device that is sensitive to the presence of a magnetic field gradient Therefore, an O-RIMS incorporating a ferromagnetic or magnetic element according to the design and function of the present invention, becomes a highly accurate and reliable magnetic field gradient sensor.

Thus, the magnetic field gradient sensor of the present invention is optically driven and optically read, is small in size, and no electrical power supplies or wires are required either on the device or external to the device. Therefore, since no electrical connections are required, device packaging is greatly simplified and the operative component of the device can comprise the O-RIMS structure on an appropriately designed die bonded directly to the tip of a light transporter, such as an optical fiber or an optical waveguide. Hence, the complete sensor can have a diameter no bigger than the tip of the light transporter used.

Moreover, the present invention is fast, such that depending on design parameters of the microbeam, shell, fulcrum, and ferromagnetic or magnetically permeable element, magnetic field gradient measurements could be taken in a millisecond or less. The magnetic field gradient sensor of the present invention requires very little optical power, typically an optical signal of only several microwatts or less should be sufficient to drive it.

By modulating a high-frequency carrier (typically in the range of hundreds of kHz), this magnetic field gradient sensor is relatively immune to 1/f noise. In addition, due to the fact that the photodiode is physically located close to the microbeam, and any distant communication between the sensor electronics and the photodiode is via the light transporter, and since a light transporter intended for use with the present invention eliminates signal-to-noise ratio problems that arise with transmission of electrical signals through long metallic conductors, the present invention offers an even greater advantage in the signal-to-noise performance over long distances.

SUMMARY OF THE INVENTION

In accordance with one aspect of the present invention, a device for sensing a magnetic field gradient comprises a shell having an outer surface and an inner surface, a beam affixed to the inner surface of the shell, a magnetically permeable element in mechanical connection to the outer surface of the shell, a photodiode in proximity to the beam, and a light transporter having an end proximate to the outer surface of the shell.

In accordance with another aspect of the present invention, a method for sensing a magnetic field gradient using a magnetically permeable element mechanically coupled to a resonant beam comprises directing a first light wave to the beam, exciting the beam to a resonant frequency in response to the first light wave, and transmitting a second light wave having a property corresponding to the resonant frequency of the beam away from the beam.

In accordance with yet another aspect of the present invention, an optically-powered integrated microstructure magnetic field gradient sensor comprises a substrate, a microbeam, a photodiode, a cantileveredly supported magnetically permeable element, and an optical fiber. The substrate supports a polysilicon shell having an outer surface and an inner surface, the inner surface defining an evacuated cavity enclosing an area of the substrate, and the outer surface of the shell defines an area surrounded by supports extending from a plane of the substrate. The microbeam is affixed to the inner surface of the shell within the evacuated cavity by posts. The photodiode is integrated into the substrate at a surface location beneath the microbeam. The cantileveredly supported magnetically permeable element is suspended in mechanical connection to the outer surface of the shell within the area surrounded by the supports. The optical fiber has a distal end and a proximate end, and the proximate end is disposed at the outer surface of the shell within the area surrounded by the supports.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
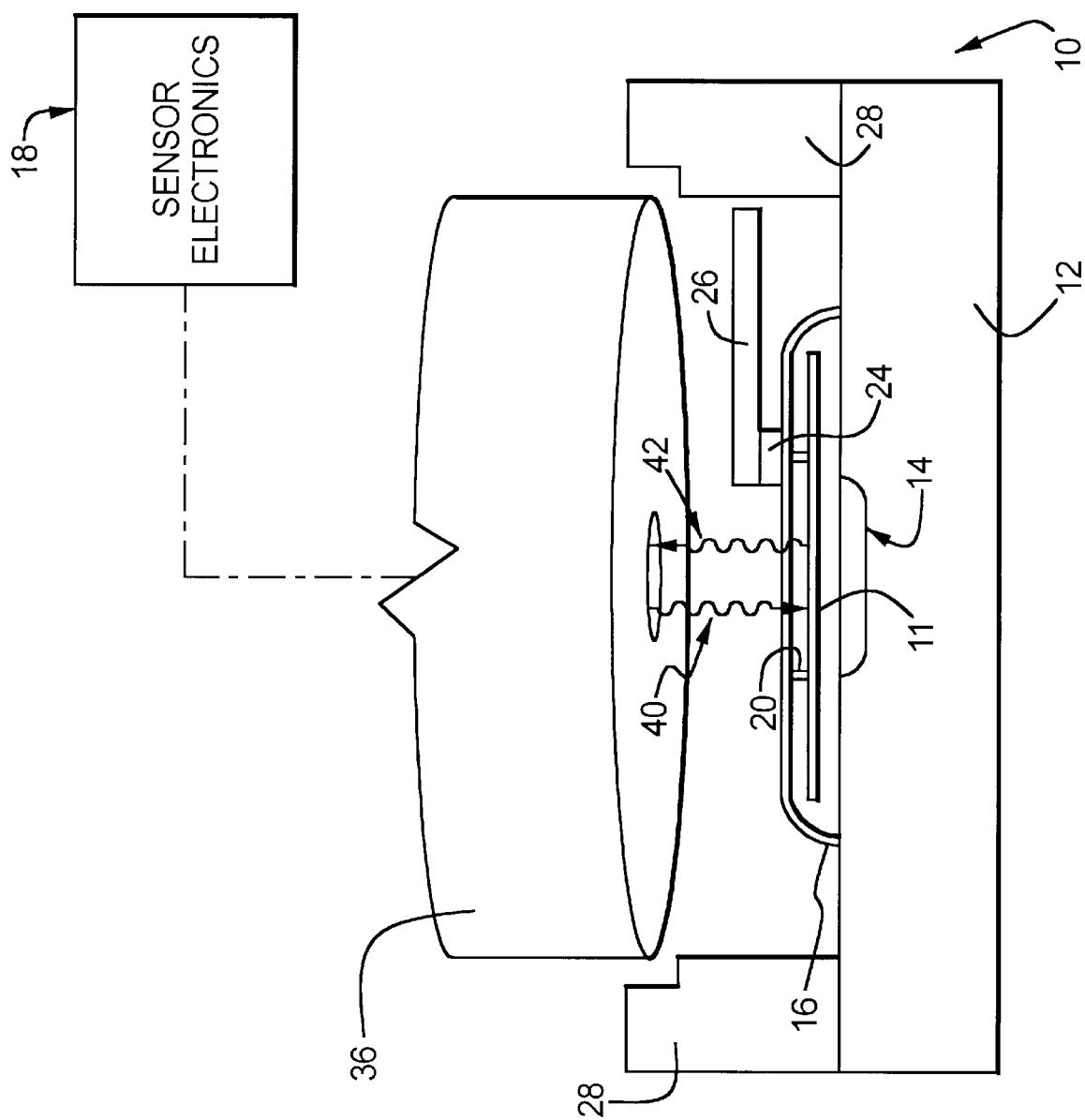
FIG. 1 illustrates an O-RIMS magnetic field gradient sensor according to an exemplary aspect of the present invention.

One embodiment of an exemplary aspect of a magnetic field gradient sensor device 10 of the present invention is shown in FIG. 1.

The device 10 incorporates a resonant microbeam 11, a planar silicon substrate 12, a photodiode 14 formed in the substrate 12, a polysilicon shell 16, and a magnetically permeable element 26. The polysilicon shell 16 is flexible and has an outer surface and an inner surface. The photodiode 14 and the shell 16 are supported by the surface of the substrate 12. The inner surface of the shell 16 defines an enclosure which is evacuated to form a vacuum chamber therein.

The magnetically permeable element 26 comprises a ferromagnetic material or a magnetically permeable material, such as PERMALLOY®, and is mechanically contacted to the outer surface of the shell 16 via a fulcrum 24.

The microbeam 11, the substrate 12 and the shell 16 create a Fabry-Perot cavity, such that input light waves 40 delivered thereto by a light transporter 36 and reflected therefrom interfere with one another as they re-enter the light transporter 36, creating an output optical signal 42 whose intensity changes as the microbeam 11 vibrates.

The light transporter 36 may comprises any number of devices that convey a light wave, including but not limited to an optical fiber or an optical waveguide. For discussion purposes however, the term optical fiber is used interchangeably with the term light transporter to refer to the element 36.

The microbeam 11 is supported by posts 20 which mechanically connect the microbeam 11 to the roof or inner surface of the interior cavity of the shell 16. The microbeam 11 and the posts 20 are micromachined from polysilicon and together form an integrated silicon device. When the device 10 is exposed to a magnetic field gradient, the field distorts the element 26, which distorts the shell 16 via the fulcrum 24. This distortion is passed onto the beam 11 through posts 20, and thereby mechanically affects the resonant frequency of the microbeam 11.

As shown in FIG. 1, an input light wave 40, typically in the infrared range (e.g. 700 nm), but not limited thereto, is conducted through the light transporter 36 and falls on the device 10. The light transporter 36 is secured proximate the shell 16 in a region adjoining its outer surface and is positioned in a light tight fashion by spacers 28 which encircle the device 10, and extend vertically from the surface of the substrate 12.

A portion of the input light 40 (e.g. approximately 20%) delivered by the optical fiber 36 reflects off of the shell 16, because the shell 16 is partially transparent to infrared light, or to the wavelength of light appropriate for use with the device 10. Another portion (e.g. approximately 40%) of the input light 40 passes through the shell 26 and reflects off of the microbeam 11, because the microbeam 11 is partially reflective and partially transparent to infrared light. A remaining portion (e.g. approximately 15%) of the input light 40 passes through the shell 26 and the microbeam 11, and reflects off of the silicon wafer substrate 12.

The portion of the light 40 that impinges on the photodiode 14 produces a change that electrostatically attracts the microbeam 11 to the photodiode 14, which is in close proximity thereto, causing mechanical resonance or vibratory motion of the microbeam 11 through the generated electrostatic force, as discussed above. Furthermore, the motion of the microbeam 11 relative to the photodiode 14 and the shell 16 produces large intensity modulations of the reflected light 42 with only small displacements of the microbeam 11.

However, the resonant frequency of the microbeam 11 depends upon the material selected for its construction and upon its dimensions and upon whether it is contracted or stretched by the posts 20, all of which are calibration factors that are chosen for the intensity of the magnetic field gradient to be measured by the device 10.

In one embodiment, the thickness of the microbeam 11 is an odd multiple of one quarter the wavelength of the light 40. Thus, the length of the cavity or space between the microbeam 11 and photodiode 14 should be somewhat less than a multiple of half the wavelength of the light 40, and the length of the cavity between the microbeam 11 and the shell 16 should be somewhat greater than one-half a wavelength. With this arrangement, the microbeam 11 vibrates between positions of $\lambda/2$ and $\lambda/4$. However, the distances can be varied by adding or subtracting $\lambda/2$, or multiples thereof, so that the reflections will have the same phase relationships.

Sensor electronics (not shown) respond to the beat frequency of the reflected light 42 which is determined by the resonant frequency of the microbeam 11 which, in turn, is determined by the distortion of the magnetically permeable element 26 in response to a magnetic field gradient.

In other words, the dimensions of the shell 16 are mechanically distorted as a result of the torque generated by the interaction of the sensed magnetic field gradient and the magnetic properties of the element 26. The mechanical distortion of the shell 16, having been delivered from the magnetically permeable element 26 to the outer surface of the shell 16 via the fulcrum 24, is conveyed to the beam 11 via the posts 20 which provide mechanical connection of the beam 11 to the interior surface of the shell 16. The strain on the microbeam 11 affects its frequency of vibration, which affects the beat frequency of the optical beam 42 that is sensed by the sensor electronics (not shown) to indicate the magnetic field gradient.

Figure 2:
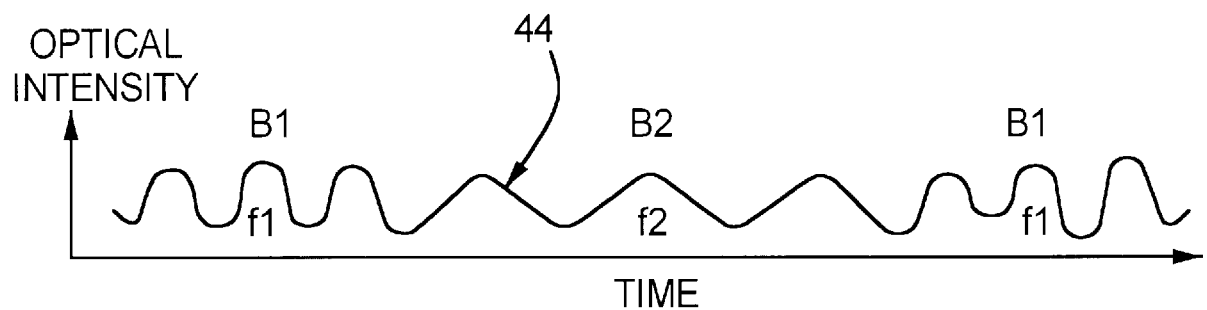
FIG. 2 illustrates an O-RIMS resonant frequency change with respect to a magnetic field gradient according to an exemplary aspect of the present invention.

FIG. 2 illustrates in schematic form how the resonant frequency of the microbeam 11 changes when exposed to a magnetic field gradient, in accordance with an exemplary aspect of the present invention.

The frequency of the microbeam 11 changes from $f_1$, when one value of a magnetic field gradient B1 is present, to $f_2$ when another value of a magnetic field gradient B2 is present, and back to $f_1$ when the original magnetic field gradient B1 is restored. These frequencies, $f_1$, $f_2$, affect the frequency of the reflected light 42, which can be use to indicate the magnitude of magnetic field gradients B1 and B2.

The shell-to-microbeam gap or the microbeam-to-substrate gap are selected so that once excited, the microbeam 11 is self-resonant. Self-resonance of the microbeam 11 occurs when the intensity of light reaching the photodiode 14 has a $\lambda/2$ phase delay with respect to the motion of the microbeam 11.

Figure 3:
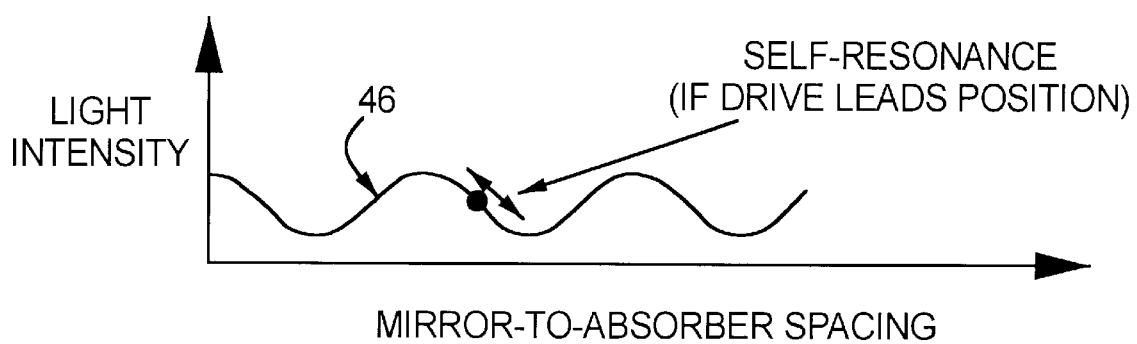
FIG. 3 illustrates an intensity of absorbed light as a function of absorber-to-mirror spacing according to an exemplary aspect of the present invention.

FIG. 3 shows the intensity of absorbed light as a function of absorber-to-mirror spacing in accordance with an exemplary aspect of the present invention. Self-resonance occurs when the intensity of light reaching the photodiode 14, and hence the intensity of the drive signal on the microbeam 11, has a $\lambda/2$ phase delay with respect to the motion of the microbeam 11, as shown in FIG. 3.

Thus, with respect to the exemplary aspect of the present invention shown in FIG. 3, what is referred to as the absorber is in the form of the photodiode 14, and what is referred to as the mirror is in the form of the bottom of the microbeam 11.

Due to the fact that the photodiode 14, which forms the absorber, is situated beneath the microbeam 11 and is therefore in adjacent but spaced apart relation to the bottom of the microbeam 11, which forms the mirror, as shown in FIG. 1, the photodiode 14 attracts the microbeam 11 and thus excites fundamental or first overtone modes of vibration.

In addition to being useful for sensing a magnetic field gradient, the present invention could be used as an all-optical commutator on a brushless electric motor, or as an all-optical surge detector on wires carrying electric current.

Modifications of the present invention will occur to those practicing in the art of the present invention.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. An optically-powered integrated microstructure magnetic field gradient sensor comprising:

a substrate supporting a polysilicon shell having an outer surface and an inner surface, said inner surface defining an evacuated cavity enclosing an area of said substrate, said outer surface of said shell defining an area surrounded by supports extending from a plane of said substrate;

a microbeam affixed to said inner surface of said shell within said evacuated cavity by posts;

a photodiode integrated into said substrate at a surface location beneath said microbeam;

a cantileveredly supported magnetically permeable element suspended in mechanical connection to said outer surface of said shell within said area surrounded by said supports; and an optical fiber having a distal end and a proximate end, said proximate end disposed at said outer surface of said shell within said area surrounded by said supports.

2. The sensor of claim 1, further comprising sensor electronics receiving, through said distal end of said optical fiber, a light wave reflected from said microbeam.

3. The sensor of claim 1, wherein said magnetically permeable element comprises PERMALLOY®.

4. The sensor of claim 1, wherein said shell, said microbeam and said substrate are micromachined.

5. The sensor of claim 1, further comprising a cantilever fulcrum that is positioned on said outer surface so that its area is at least partially above said posts.

6. The sensor of claim 5, wherein said magnetically permeable element has a maximum length dimension and said maximum length dimension lies along an axis that is parallel to said outer surface of said shell within said area surrounded by said supports.

7. A method for sensing a magnetic field gradient using a magnetically permeable element, comprising:

providing a substrate supporting a polysilicon shell having an outer surface and an inner surface, said inner surface defining an evacuated cavity enclosing an area of said substrate, said outer surface of said shell defining an area surrounded by supports extending from a plane of said substrate;

affixing a microbeam to said inner surface of said shell within said evacuated cavity by posts;

integrating a photodiode into said substrate at a surface location beneath said microbeam;

mounting said magnetically permeable element to said outer surface of said shell within said area surrounded by said supports in a cantilevered manner utilizing a fulcrum attached to said outer surface;

providing an optical fiber having a distal end and a proximate end, said proximate end disposed at said outer surface of said shell within said area surrounded by said supports;

directing a first light wave to said beam;

exciting said beam to a resonant frequency in response to said first light wave;

transmitting a second light wave having a property corresponding to the resonant frequency of said beam, away from the beam;

inducing a stress in said microbeam by applying a magnetic field proximate said magnetically permeable element, thereby causing said resonant frequency of said microbeam to change; and detecting said change in resonant frequency and correlating said change in resonant frequency with a magnetic field strength.

* * * * *